United States Patent
Nakahara et al.

(10) Patent No.: US 7,960,727 B2
(45) Date of Patent: Jun. 14, 2011

(54) ZINC OXIDE BASED COMPOUND SEMICONDUCTOR DEVICE

(75) Inventors: Ken Nakahara, Kyoto (JP); Yuji Hiroyuki, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 272 days.

(21) Appl. No.: 11/992,407

(22) PCT Filed: Sep. 21, 2006

(86) PCT No.: PCT/JP2006/318720
§ 371 (c)(1),
(2), (4) Date: Mar. 21, 2008

(87) PCT Pub. No.: WO2007/034864
PCT Pub. Date: Mar. 29, 2007

(65) Prior Publication Data
US 2009/0267062 A1 Oct. 29, 2009

(30) Foreign Application Priority Data
Sep. 22, 2005 (JP) .................. 2005-276207

(51) Int. Cl.
*H01L 29/10* (2006.01)
*C30B 25/18* (2006.01)

(52) U.S. Cl. ............... 257/43; 257/E29.094; 117/95
(58) Field of Classification Search .......... 257/43, 257/103, E29.081, E29.003, E29.094; 438/46, 438/47, 22; 117/63, 95, 902
See application file for complete search history.

(56) References Cited

U.S. PATENT DOCUMENTS

| 7,438,762 B2 * | 10/2008 | Kato et al. ............. 117/94 |
| 7,829,207 B2 * | 11/2010 | Kato et al. ............. 428/698 |
| 2004/0235212 A1 * | 11/2004 | Ishizaki ................ 438/46 |
| 2005/0242357 A1 | 11/2005 | Uematsu et al. |
| 2007/0152233 A1 * | 7/2007 | Kato et al. .............. 257/103 |

FOREIGN PATENT DOCUMENTS

| JP | 2004-200389 A | 7/2004 |
| JP | 2004-221132 A | 8/2004 |
| JP | 2004-304166 | 10/2004 |
| WO | WO-01/73170 | 10/2001 |

OTHER PUBLICATIONS

Fortunato et al., "Recent advances in ZnO transparent thin film transistors", 2005, Thin Solid Films, vol. 487, pp. 205-211.*
Nakahara K. et al., "Growth of N-doped and Ga + N-codoped ZnO films by radical source molecular beam epitaxy", Journal of crystal growth, vol. 237-339, 2002, pp. 503-508.
Tsukazaki, A. et al., "Repeated temperature modulation epitaxy for p-type doping and light-emitting diode based on ZnO", Nature Materials, vol. 4, Issue 1, 2005, pp. 42-46.

* cited by examiner

*Primary Examiner* — Thomas L Dickey
*Assistant Examiner* — Nikolay Yushin
(74) *Attorney, Agent, or Firm* — Rabin & Berdo, P.C.

(57) ABSTRACT

There is provided a zinc oxide based compound semiconductor device which, even when a semiconductor device is formed by forming a lamination portion having a hetero junction of ZnO based compound semiconductor layers, does not cause any rise in a drive voltage while ensuring p-type doping, and, at the same time, can realize good crystallinity and excellent device characteristics. ZnO based compound semiconductor layers (2) to (6) are epitaxially grown on the principal plane of a substrate (1) made of $Mg_xZn_{1-x}O$ ($0 \leq x < 1$). The principal plane of the substrate is a plane in which an A plane {11-20} or an M plane {10-10} is inclined in a direction of $-c$ axis.

5 Claims, 5 Drawing Sheets (a)

(b)

(c)

ature modulation in which the p-type ZnO based compound semiconductor layers are grown by varying the temperature between 400 and 1,000° C. reciprocally, utilizing the temperature dependence, thereby the p-type layers with sufficiently high carrier concentration being obtained (cf. for example NON-PATENT DOCUMENT 2). However, since expansion and contraction are repeated by continuous repetition of heating and cooling, a large load is applied to an apparatus, a scale of the apparatus becomes large, and a period for maintenance becomes shorter.

ZINC OXIDE BASED COMPOUND SEMICONDUCTOR DEVICE

FIELD OF THE INVENTION

The present invention relates to a zinc oxide based (hereinafter referred to as ZnO based) compound semiconductor device such as a light emitting device such as a light emitting diode (LED), a laser diode (LD) or the like, a transistor device such as a HEMT or the like, or the like, using the ZnO based semiconductor such as ZnO, MgZnO based (which means that a mixed crystal ratio of Mg and Zn can be varied variously and the same applies hereinafter) compound or the like. More particularly, the present invention relates to a ZnO based compound semiconductor device with high internal quantum efficiency obtained by forming p-type ZnO based compound semiconductor layers having high carrier concentration, while inhibiting influence to an applied voltage, such as rise of a drive voltage caused by generation of a piezoelectric field, or the like, when the semiconductor device is formed by laminating p-type ZnO and MgZnO based compound or the like with a hetero junction and an electric voltage (electric field) is applied even in a direction of laminating.

BACKGROUND OF THE INVENTION

In recent years, nitride semiconductor light emitting devices such as a blue light emitting diode (LED), a laser diode (LD) or the like, using nitride semiconductor, have been in practical use. On the other hand, a ZnO based compound is superior to a GaN based compound (which means, besides GaN, a compound in which a part or all of Ga is substituted with other element of group III element and the same applies hereinafter) in emitting light in a range of a short wavelength. Concretely, that is because an exciton of ZnO, which is formed by recombination of a hole and an electron in a solid, is stable even at a room temperature because of having a large binding energy of 60 meV (GaN has that of 24 mev). Thus, the ZnO based compound is expected for a light emitting device, a light receiving device or the like of a blue or ultraviolet region, in place of GaN, however, as it is known that crystal defects or the like occur by oxygen vacancies or Zn atoms between lattices in the ZnO based compound, the ZnO based compound becomes to have normal n-type conductivity because electrons not contributing are generated by the crystal defects, and it is necessary to lower concentration of the remained electrons to form ZnO based compound of p-type conductivity.

Concretely, although a sapphire substrate is generally used, a principal plane of which is a C plane, in order to form a semiconductor device using ZnO based compound, ZnO based compound semiconductor layers on the sapphire substrate are usually grown in a direction of −c axis (oxygen plane). However, in the ZnO based compound semiconductor layers formed by crystal growth in the direction of −c axis, since a doping effect of nitrogen of a p-type dopant depends strongly on temperature, temperature of the substrate is required to be lowered in order to dope with nitrogen. If the temperature of the substrate is lowered, crystallinity becomes to be lowered, centers compensating acceptors are introduced, and nitrogen can not be activated after all, thereby the p-type ZnO based compound semiconductor layers with sufficiently high carrier concentration can not be obtained (cf. for example NON-PATENT DOCUMENT 1). In addition, there is known a method of temperature modulation in which the p-type ZnO based compound semiconductor layers are grown by varying the temperature between 400 and 1,000° C.

On the other hand, the present inventors studied other methods for forming the p-type ZnO based compound semiconductor layers with high carrier concentration, and, as a result, it was found and already disclosed that, on a ZnO substrate (Zn plane) or a sapphire substrate in which a principal plane is a C plane and orientated to +c axis, a GaN layer orientated to +c axis is formed as a base layer, and ZnO based compound semiconductor layers orientated to the same direction, namely to +c axis, are laminated thereon, thereby c axis orientations of the substrate, the GaN layer of the base layer and the ZnO based compound semiconductor layers are arranged to be equal, excellent crystallinity is maintained, and the p-type ZnO based compound semiconductor layers with high carrier concentration can be formed (cf. for example PATENT DOCUMENT 1).

PATENT DOCUMENT 1: Japanese Patent Application Laid-Open No. 2004-304166
NON-PATENT DOCUMENT 1: Journal of Crystal Growth 237-239 (2002)503
NON-PATENT DOCUMENT 2: Nature Material vol. 4 (2005) p. 42

DISCLOSURE OF THE INVENTION

Problem to be Solved by the Present Invention

As described above, when ZnO based compound semiconductor layers are laminated, it is preferable that, on the ZnO substrate or the like in which the principal plane is a C plane and orientated to +c axis, the ZnO based compound semiconductor layers are laminated so as to be orientated to the same direction, namely to +c axis, because p-type ZnO based compound semiconductor layers with high carrier concentration can be easily formed and a semiconductor device with high efficiency can be obtained.

However, when a light emitting device or the like is formed by using the substrate in which the principal plane is the C plane and forming a semiconductor lamination portion having a hetero junction with such as ZnO or MgZnO based compound which is orientated to +c axis, there is a problem such that an applied forward voltage rises and extra joule heat is generated, thereby a life time of the device is shortened, as described later.

The present invention is directed to solve the above-described problem and an object of the present invention is to provide a zinc oxide based compound semiconductor device which does not cause rise of a drive voltage while raising p-type doping efficiency even when a semiconductor device is formed by forming a lamination portion having a hetero junction of ZnO based compound semiconductor layers while using ZnO based compound semiconductor more advantageous than GaN based compound in emitting light of a short wavelength, and still has excellent crystallinity and device characteristics.

Means for Solving the Problem

The present inventors studied earnestly and repeatedly on a cause of rise of a drive voltage occurring when a light emitting device or the like is formed by using a substrate in which a principal plane is a C plane and laminating ZnO based compound semiconductor layers so as to be orientated to +c axis. And, as a result, it was found that the cause is originated in a piezoelectric field generated depending on a strain since ZnO based compound is piezoelectric material, because, when a hetero junction is formed, the strain arises between the substrate and the semiconductor layer or two of the semiconductor layers, caused by a small difference in lattice constants which occurs even between semiconductor layers of the same kind when mixed crystal ratios of Mg are different between the semiconductor layers laminated, for example, a ZnO layer and a MgZnO compound layer, or two of the MgZnO compound layers. Namely, the piezoelectric field becomes a potential barrier applied additionally to carriers, and the drive voltage is raised by rise of a built-in voltage in a diode or the like.

In detail, when stress is applied to a crystal having piezoelectricity, a piezoelectric field generates electric charges of + or − reversely whether the stress is a compressive force or a tensile force, as shown in FIGS. 7(a) and 7(b). On the contrary, a crystal of a hexagonal system such as ZnO has no symmetrically in a direction of −c axis, and a direction of c axis (surface perpendicular to the C plane) is a polar plane in which two directions distinguished by deviation of electric charges exist. Therefore, electric charges of + and − are generated on both sides of the C plane of the crystal layer by the stress described above, and the electric charges are not generated or generated very slightly on an A plane and an M plane which are nonpolar planes. And it was found that a cause of rise of a drive voltage is rise of a built-in voltage caused by generation of electric charges of + at a ZnO layer 33 side of a MgZnO layer 34 in which a compressive strain arises and electric charges of a reverse polarity at a reverse side as shown in FIG. 7(c), in the ZnO layer 33 and the MgZnO layer 34 laminated on the C plane.

Then, the present inventors found that the problem caused by a piezoelectric field can be solved by laminating ZnO based compound semiconductor layers such that a plane on which electric charges are generated by a stress is parallel to a direction of an electric field applied to a device (such that a piezoelectric field is perpendicular to an electric field applied to a device).

On the other hand, when the piezoelectric field is perfectly perpendicular to the electric field applied to a device, the problem of the piezoelectric field can be surely solved as described above, however, ZnO based compound semiconductor layers laminated on the substrate are not orientated to +c axis, thereby p-type ZnO based compound semiconductor layers with high carrier concentration can not be occasionally obtained. Then, the present inventors further studied earnestly and found, as a result, that if it is intended to make a substrate made of $Mg_xZn_{1-x}O$ (0≦x<1) or the like, the principal plane of which is a plane such that the piezoelectric field is perfectly perpendicular to the electric field applied to the device, namely an A plane or an M plane, there occur cases such that the principal plane is not a perfectly flat, and there occurs difference of doping efficiencies of nitrogen of the p-type dopant which depends to directions of planes (step planes) formed at level difference portions which are formed by occurrence of the level difference on the substrate surface.

Then, it was found that the problem of nitrogen doping for the p-type ZnO based compound semiconductor layers can be solved by using a substrate in which directions of the planes formed at the level difference portions are inclined to a certain direction, namely inclined so as to expose planes which can take in much nitrogen of a p-type dopant.

Therefore, a zinc oxide based compound semiconductor device according to the present invention includes a substrate made of $Mg_xZn_{1-x}O$ (0≦x<1, preferably 0≦x≦0.5), the substrate having a principal plane which is a plane that an A plane {11-20} or an M plane {10-10} is inclined in a direction of −c axis, and ZnO based compound semiconductor layers epitaxially grown on the principal plane of the substrate made of the $Mg_xZn_{1-x}O$.

Here, the zinc oxide (ZnO) based compound semiconductor means an oxide including Zn, and means concretely besides ZnO, an oxide of one or more elements of group IIA and Zn, an oxide of one or more elements of group IIB and Zn, or an oxide of elements of group IIA and group II B and Zn. In addition, (11-20), (10-10), {11-20} and {10-10} mean strictly (11$\bar{2}$0), (10$\bar{1}$0), {11$\bar{2}$0} and {10$\bar{1}$0}, however, an abbreviated notation is used as described above in convenience. In addition, for example, a {11-20} plane means a general term meaning including planes equivalent to a (11-20) plane by symmetrically of crystals.

In concrete, single crystal layers of ZnO based compound semiconductor are epitaxially grown on the substrate as a semiconductor lamination portion including a hetero junction so as to form a light emitting layer of a light emitting diode or a laser diode, thereby a zinc oxide based compound semiconductor light emitting device is constituted. By this construction, p-type ZnO based compound semiconductor layers which have sufficiently high carrier concentration can be formed, and a semiconductor light emitting device with a low drive voltage and excellent device characteristics can be also obtained, while inhibiting extra generation of joule heat.

Effect of the Invention

According to the present invention, since the substrate made of $Mg_xZn_{1-x}O$ (0≦x<1) having the principal plane of that the A plane {11-20} or the M plane {10-10} is inclined in a direction of −c axis is used, planes (terrace planes) except step planes of the principal plane on the substrate are the A plane {11-20} or the M plane {10-10}, and the step planes are the +C plane of the exposed $Mg_xZn_{1-x}O$ (0≦x<1) orientated to the direction of +c axis. Therefore, ZnO based compound layers grown thereon are formed as perfect single crystal layers in which a plane parallel to the terrace plane is laminated being orientated to the {11-20} plane or the {10-10} plane and, at the same time, a plane parallel to the step plane is orientated to the +C plane (orientated to +c axis within the plane).

In addition, the +C plane appears only at the step planes, moreover, appears slightly within a surface on which ZnO based compound semiconductor layers are laminated. As a result, even when a piezoelectric field is generated by stress which arises between the substrate and the semiconductor layer laminated or between two of the semiconductor layers laminated, by difference in mixed crystal ratios of Mg or the like in a hetero junction, since a direction of the piezoelectric field is almost perpendicular to a direction of an electric field generally applied to a semiconductor device which is perpendicular to a semiconductor lamination portion, the piezoelectric field does not give any influence to the applied voltage for the semiconductor device. Then, in case of forming a light emitting device by laminating, for example, ZnO based compound semiconductor layers with a hetero junction, there exists no problem such as rise of a drive voltage even without interposing a gradient layer or a buffer layer for alleviating lattice mismatching.

In addition, MgZnO based crystal orientated to a direction of +c axis becomes to appear at the +C plane slightly appearing as the step planes of the principal plane. Since crystals are grown mainly at the step portions, ZnO based compound layers orientated to +c axis are formed mainly at the step portions, quantity of taking in nitrogen of a p-type dopant increases, and p-type ZnO based compound semiconductor layers with high carrier concentration orientated to +c axis can be easily formed. Therefore, a semiconductor device with high efficiency besides inhibiting rise of a drive voltage and lowering of a device life time can be obtained.

EXPLANATION OF LETTERS AND NUMERALS

Figure 1:
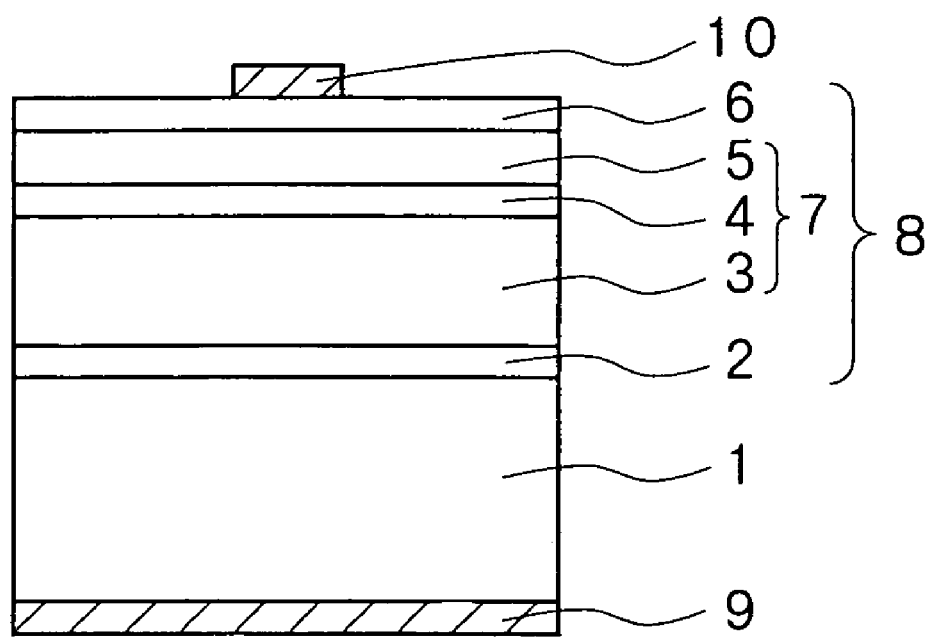
FIG. 1 is an explanatory cross-sectional view showing a LED of an embodiment of the ZnO based compound semiconductor device according to the present invention.

1: substrate
2: n-type buffer layer
3: n-type layer
4: active layer
5: p-type layer
6: p-type contact layer
7: light emitting layer forming portion
8: semiconductor lamination portion
9: n-side electrode
10: p-side electrode

THE BEST EMBODIMENT OF THE PRESENT INVENTION

An explanation will be given below of a zinc oxide based (ZnO based) compound semiconductor device according to the present invention in reference to the drawings. The ZnO based compound semiconductor device according to the present invention is formed, as an explanatory cross-sectional view of a light emitting diode (LED) of an embodiment thereof is shown in FIG. 1, by growing ZnO based compound semiconductor layers 2 to 6 epitaxially on a principal plane of a substrate 1 made of $Mg_xZn_{1-x}O$ ($0 \leq x < 1$, preferably $0 \leq x \leq 0.5$, and the same applies hereinafter). The principal plane of the substrate is a plane in which an A plane (11-20) or an M plane (10-10) is inclined in a direction of −c axis.

Figure 2:
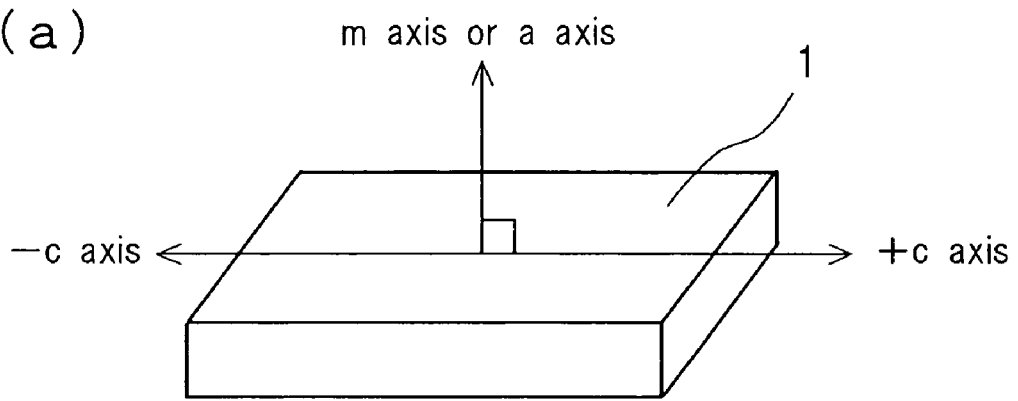
FIG. 2 is an explanatory figure showing the details of a substrate used in the semiconductor device according to the present invention.
Figure 2:
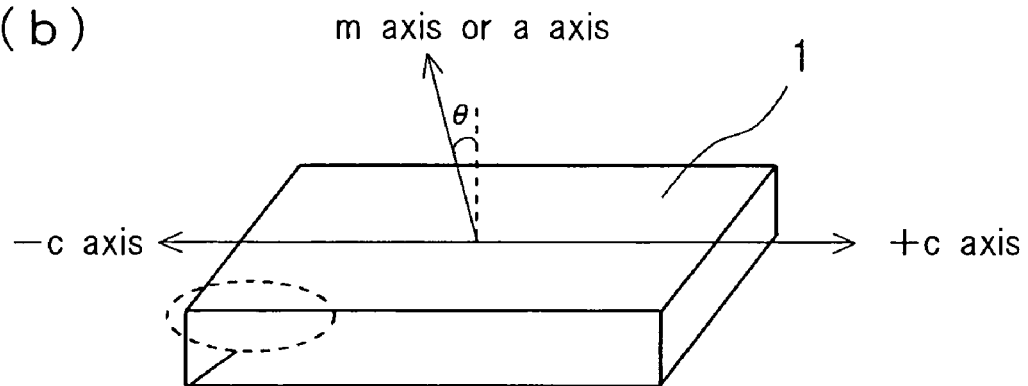
Figure 2:
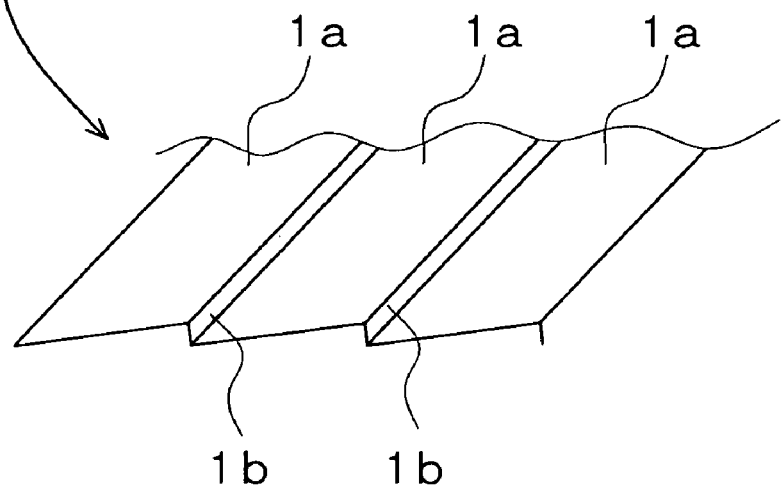

As shown in FIG. 2(b), the substrate 1 is made of $Mg_xZn_{1-x}O$ (for example, ZnO of x=0) and polished such that the principal plane is inclined in a direction of −c axis from the A plane or the M plane. An inclining angle is approximately 0.1 to 10 degrees, more preferably 0.3 to 5 degrees.

Here, a reason why the principal plane is the plane in which the A plane or the M plane is inclined in the direction of −c axis will be given below in detail. FIG. 2(a) shows a schematic figure of a substrate, a principal plane of which is the A plane or the M plane not inclined. If such substrate is used, the problem of the piezoelectric field can be solved and rise of the drive voltage can be inhibited as describe above.

However, the present inventors discovered that even if it is intended to form a substrate made of $Mg_xZn_{1-x}O$ having a flat plane shown in FIG. 2(a) as the principal plane formed with the A plane or the M plane, actually the flat plane can not be formed, and step planes 1b and terrace planes 1a of another planes are formed by level difference on a surface as shown in FIG. 2(c), but by orientating the step planes to +c axis, a carrier concentration in a p-type layer can be enhanced.

More concretely, as an enlarged view of a surface portion of the substrate shown in FIG. 2(b) is shown in FIG. 2(c), by inclining the A plane or the M plane (inclining a axis or m axis), there are formed, on the principal plane, terrace planes 1a and step planes 1b with equal intervals and regularity at level difference portions formed by inclining. In addition, by making an inclining direction a direction of −c axis, $Mg_xZn_{1-x}O$ (+C plane) orientated to +c axis is exposed at the step planes 1b. When ZnO based compound semiconductor layers are laminated on such inclined substrate, crystal growth of the ZnO based compound semiconductor layers occurs mainly at the step planes 1b in a proper range of temperature, and as the present inventor already disclosed in patent document 1, quantity of taking in nitrogen of the p-type dopant is increased remarkably at +C planes of step planes 1b, thereby, the p-type ZnO based compound semiconductor layers orientated to the m axis or the axis, with high carrier concentration can be formed.

Figure 3:
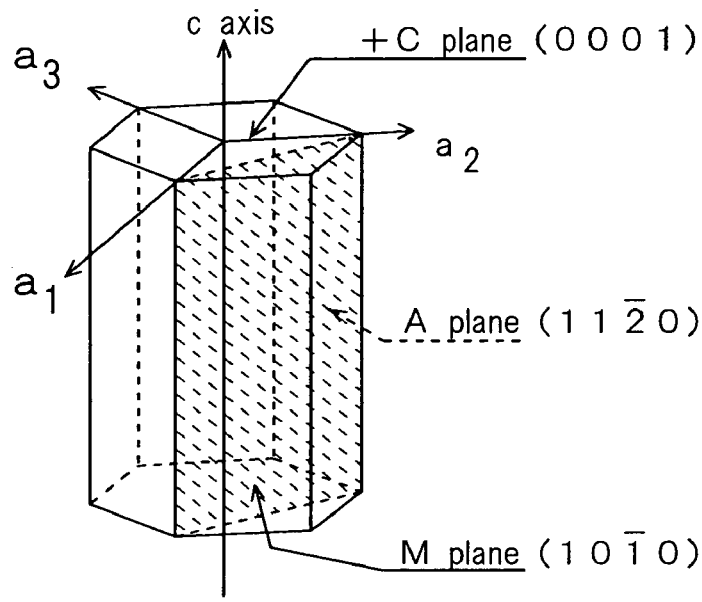
FIG. 3 is a figure for explaining a ZnO crystal structure.

In addition, the ZnO based compound, for example $Mg_xZn_{1-x}O$, has a structure of a hexagonal system shown by a perspective view in FIG. 3 showing a schematic figure of a crystal structure, and as the A plane (10-20) and the M plane (10-10) are planes shown in FIG. 3 respectively, and both are planes orthogonal to the C plane. The substrate 1 may be made of ZnO of x=0, or MgZnO based compound of a mixed crystal of Mg. It is not preferable that a concentration of Mg is over 50 at %, because the substrate does not match with ZnO based compound of a hexagonal system and phase separation is apt to arise since MgO is a crystal of a NaCl type.

The $Mg_xZn_{1-x}O$ substrate is formed by cutting out wafers from an ingot formed by a hydrothermal synthesis method. The cutting out is carried out such that a principal plane is an inclined plane of the A plane or the M plane to a direction of −c axis, as described above. Although crystallinity (c axis orientation) of ZnO based compound to be grown thereon is not affected even when a mixed crystal ratio of Mg of the substrate 1 is zero, it is preferable that material having a band gap larger than that of emitted light depending on a wavelength (composition of an active layer) of light to be emitted, because emitted light is not absorbed by the substrate 1.

In an example shown in FIG. 1, a semiconductor lamination portion 8 is made of n-type ZnO and composed of a buffer layer 2 having a thickness of, for example, approximately 10 nm, a light emitting layer forming portion 7 and a contact layer 6 made of p-type ZnO and having a thickness of approximately 10 to 30 nm. However, the example is shown as an example of a simple structure and the structure is not limited to the lamination structure.

In the example shown in FIG. 1, the light emitting layer forming portion 7 is formed with a double hetero junction structure in which an active layer 4 is sandwiched by an n-type layer 3 and a p-type layer 5 which are made of $Mg_yZn_{1-y}O$ ($0 \leq y \leq 0.3$, for example y=0.1) having a band gap energy larger than that of the active layer 4. Although not shown in the figure, the active layer 4 is formed with a multi quantum well structure (MQW) which is formed with a lamination structure composed of, for example from a lower layer side, an n-type guide layer made of n-type $Mg_zZn_{1-z}O$ ($0 \leq z \leq 0.15$, for example $z=0.05$) having a thickness of approximately 0 to 15 nm, a lamination portion formed by laminating a $Mg_{0.1}Zn_{0.9}$ layer having a thickness of approximately 6 to 15 nm and a ZnO layer having a thickness of approximately 3 to 5 nm, alternately six times, and a p-type guide layer made of p-type $Mg_zZn_{1-z}O$ (for example, $z=0.05$) having a thickness of approximately 0 to 15 nm, so as to emit light having, for example, a wavelength of approximately 365 nm. However, the structure of the light emitting layer forming portion 7 is not limited to the example, and, for example, a structure of the active layer 4 may be a single quantum well (SQW) structure or a bulk structure, and a p-n structure of a single hetero junction may be used instead of the double hetero junction. In addition, the n-type layer 3 or the p-type layer 5 may be formed with a structure of a lamination by a barrier layer and a contact layer, a gradient layer may be provided between layers of the hetero junction, and still, a reflection layer may be formed at a substrate side.

Then, after polishing a back surface of the substrate 1 so that a thickness of the substrate 1 is approximately 100 μm, an n-side electrode 9 is formed by laminating Ti and Al on the back surface and sintering, a p-side electrode 10 is formed with a lamination structure made of Ni/Au by a lift off method on a surface of the p-type contact layer 6, and a wafer is divided into chips, thereby a light emitting device chip shown in FIG. 1 is formed. The n-side electrode 9 may be formed on a surface of the n-type layer 3 exposed by etching a part of the semiconductor lamination portion 8 instead of forming on the back surface of the substrate 1.

In manufacturing the light emitting diode, firstly a wafer is formed by cutting an ingot of ZnO made by, for example, a hydrothermal synthesis method at a plane formed by inclining an A plane (11-20) or a M plane (10-10) to a direction of −c axis with an angle of approximately 0.1 to 10 degrees and polishing by a CMP (chemical mechanical polish) method. An MBE apparatus is used in growing ZnO based compound, which is equipped with a radical source generating oxygen radical in which reaction activity of oxygen is enhanced by RF plasma. A radical source of the same type is prepared for nitrogen of a dopant of p-type ZnO. Metal Zn, metal Mg or the like having a purity of 6-N (99.9999%) or more is used for a Zn source, a Mg source and a Ga source (n-type dopant) and vaporized from a knousen cell (evaporation source). A shroud in which liquid nitrogen flows is provided around the MBE chamber so that a wall surface is not heated by heat radiation from the cell or a substrate heater. Thereby, high vacuum of approximately $1 \times 10^{-9}$ Torr can be maintained within the chamber.

After setting the above-described wafer made of ZnO and polished by the CMP method within the MBE apparatus, a thermal cleaning is carried out at a temperature of approximately 700° C., the temperature of the substrate is lowered to approximately 600° C. thereafter, and the n-type buffer layer 2 is grown, and each layer of the above-described constitution is grown successively, thereby the semiconductor lamination portion 8 is formed. Then, as described above, after thinning the substrate 1, there are formed the p-side electrode 10 of the lamination structure of Ni/Au on the p-type contact layer 6 of a surface side by a lift off method using a vapor deposition method or the like, and the n-side electrode 9 ensuring ohmic characteristics by sintering Ti/Al laminated on a back surface of the substrate 1 at 600° C. and for approximately 1 minute. Thereafter, chips are obtained from the wafer by dicing or the like.

Although the above-described example is an example of a LED, also in a laser diode (LD) a semiconductor lamination portion of a hetero junction is formed and a drive voltage is applied in a direction perpendicular to the lamination portion. So, by using the substrate 1 made of $Mg_xZn_{1-x}O$ (for example, $x=0$) having a principal plane in which an A plane or an M plane is inclined in a direction of −c axis, the p-type ZnO based compound semiconductor layers with high carrier concentration can be formed and a semiconductor laser with a high characteristics of a low drive voltage and a low threshold current can be obtained. An example of a structure of such semiconductor laser is shown in FIG. 4.

Figure 4:
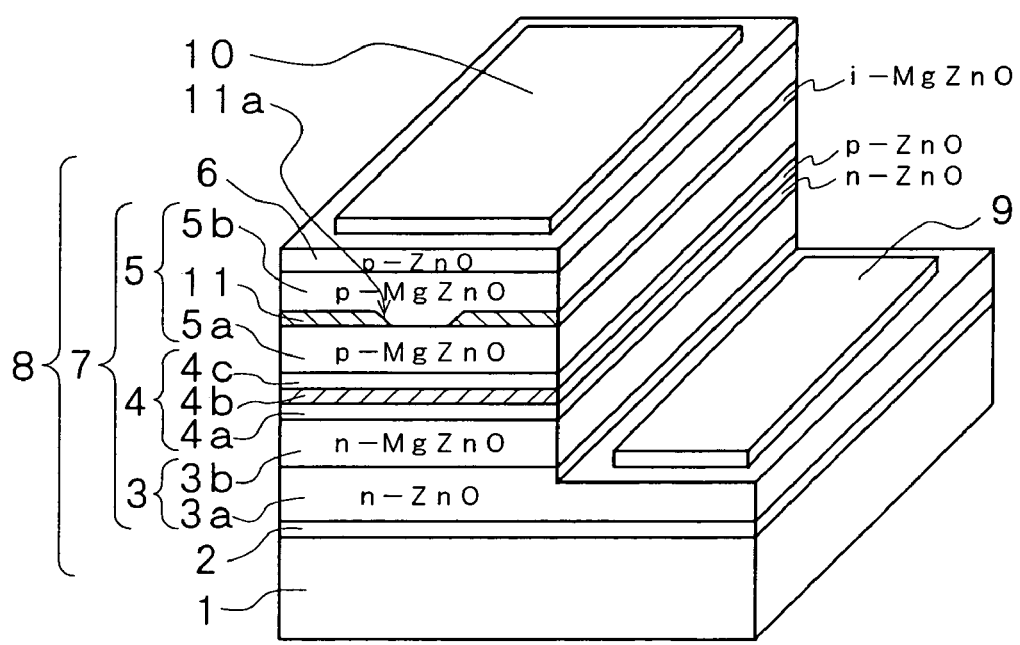
FIG. 4 is an explanatory cross-sectional view showing an example of a constitution of a LD formed by the present invention.

A substrate 1 and a buffer layer 2 shown in FIG. 4 are same as those in an example shown in FIG. 1. In the example, a light emitting layer forming portion 7 is composed of: an n-type layer 3 composed of an n-type contact layer 3a made of ZnO and a barrier layer (clad layer) 3b made of $Mg_yZn_{1-y}O$ ($0 \leq y \leq 0.3$, for example $y=0.2$); an active layer 4 formed with a lamination structure of, as shown in the figure similarly to the example described above, an n-type guide layer 4a made of n-type $Mg_zZn_{1-z}O$ (for example $z=0.05$), a lamination portion 4b made of $Mg_{0.1}Zn_{0.90}/ZnO$, and a p-type guide layer 4c made of p-type $Mg_zZn_{1-z}O$; and a p-type layer 5 which is divided into a first layer 5a and a second layer 5b, both being made of same $Mg_yZn_{1-y}O$ ($0 \leq y \leq 0.3$), and between them, an electric current constriction layer 11 provided with a stripe groove 11a and made of $Mg_aZn_{1-a}O$ ($0 < a \leq 0.3$, for example $a=0.15$) of an i-type or an n-type being inserted. Then, on a surface thereof, by laminating a p-type contact layer 6 made of p-type ZnO, the semiconductor lamination portion 8 is formed including the buffer layer 2 to the contact layer 6. Then, a p-side electrode 10 is formed by using the same material as that described above on the contact layer 6, however, it is formed on almost whole surface in this case since light is not taken out from a surface side of the lamination portion, and an n-side electrode 9 is formed on the n-type contact layer 3a exposed by removing a part of the semiconductor lamination portion 8 by etching. The n-side electrode 9 may be formed on a back surface of the substrate 1 similarly to the example shown in FIG. 1.

Even in such LD, although a piezoelectric field caused by a stress with a hetero junction is also generated, since semiconductor layers are laminated on a substrate 1 having a principal plane in which an A plane or an M plane is inclined in a direction of −c axis, a drive voltage of the LD is hardly influenced and since p-type ZnO based compound semiconductor layers with high carrier concentration can be formed, a LD with an excellently high characteristics with a low threshold current can be obtained.

Figure 5:
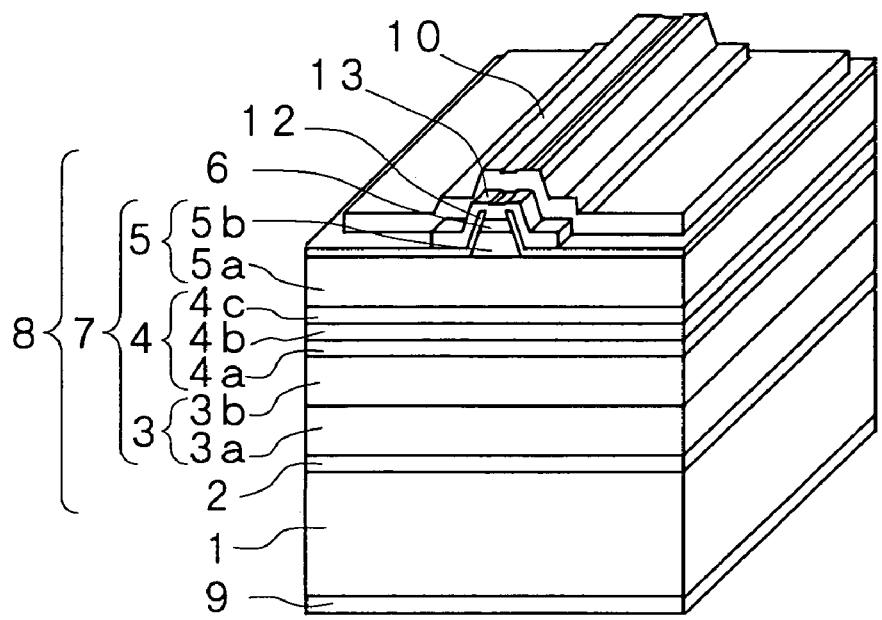
FIG. 5 is an explanatory cross-sectional view showing another example of a constitution of a LD formed by the present invention.

FIG. 5 shows an example of a semiconductor laser having a ridge structure, in which the n-side electrode 9 is provided on a back surface of the substrate 1. In FIG. 5, since a lamination structure up to the p-type first layer 5a is same as that shown in FIG. 4, the same letters and numerals are attached to the same parts and an explanation is omitted. A p-type second layer 5b having the same composition as that of the p-type first layer 5a, and a p-type contact layer 6 made of p-type ZnO are laminated thereon interposing a etching stop layer not shown in the figure, thereby a semiconductor lamination portion 8 from a buffer layer 2 to the contact layer 6 is formed.

Thereafter, a mask, not shown in the figure, made of $SiO_2$ or the like is formed, and the semiconductor lamination portion 8 is formed in a mesa shape by etching the contact layer 6 and the p-type second layer 5b by wet etching or the like. Then, while the mask is left as it is, an insulating layer made of, for example, $ZrO_2$ is deposited by, for example, a sputtering method or the like, thereafter, by removing the mask, an insulating layer 12 made of $ZrO_2$ is formed on a side wall portion except an upper surface of the mesa shape and a bottom surface of the mesa shape. Then, by providing a film of Ni/Au or the like on the whole surface by a vapor deposition method or the like, and patterning, a p-side contact electrode 13 is formed only near the stripe shaped mesa region. Thereafter, a p-side pad electrode 10 with a lamination portion of Ni and Au is formed on almost whole surface except a surrounding of chips by, for example, a lift off method. Then, after thinning the substrate 1 to a thickness of approximately 100 μm by polishing a back surface of the substrate 1, an n-side electrode 9 is formed which is made of a Ti—Al alloy or the like by forming films of Ti and Au by using a vapor deposition method or the like, and sintering. And, dividing a wafer into chips by cleaving or the like is the same as that of the example described above. In addition, the materials for electrodes and the lamination structure of semiconductor constituting LDs are not limited to the example described above, and various lamination structures may be employed.

Figure 6:
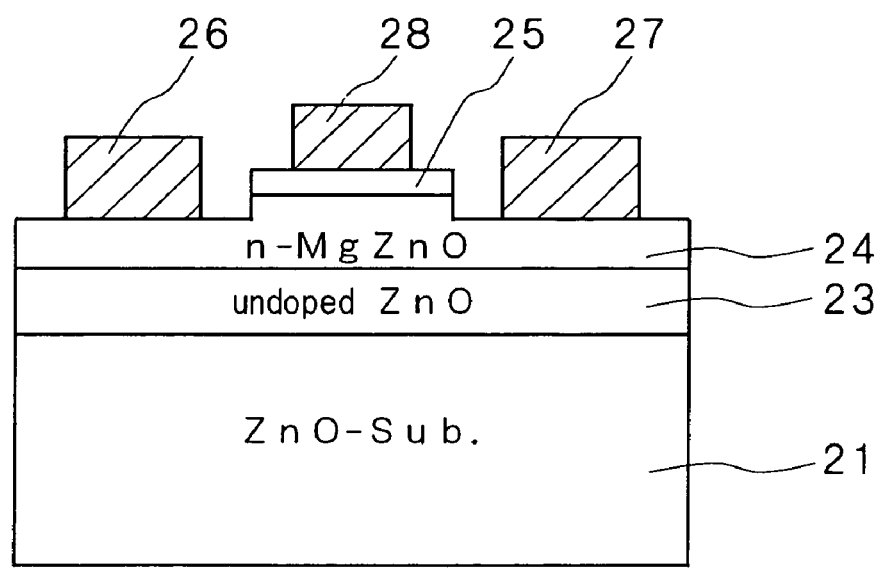
FIG. 6 is an explanatory cross-sectional view showing an example of a constitution of a transistor formed by the present invention.
Figure 7:
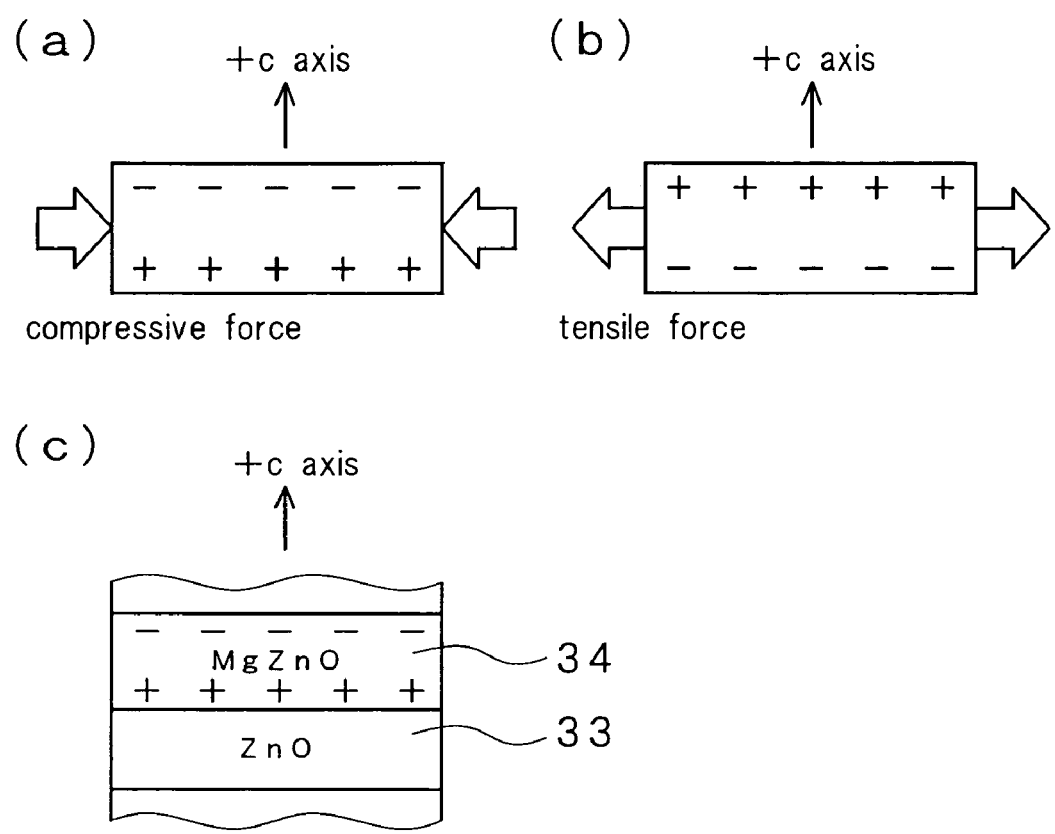
FIG. 7 is a figure explaining generation of electric charges in case of applying stress to a piezoelectric crystal.

FIG. 6 is an explanatory cross-sectional view explaining a transistor constituted by forming ZnO based compound semiconductor layers which are grown on a principal plane of a ZnO substrate 1, the principal plane of which is the above-described plane in which A plane {11-20} or M plane {10-10} is inclined in a direction of −c axis. In the example, there are grown sequentially an undoped ZnO layer 23 of approximately 4 μm thickness, an n-type MgZnO based compound electron transit layer 24 of approximately 10 nm thickness and an undoped MgZnO based compound layer 25 of approximately 5 nm thickness, and then, the electron transit layer 24 is exposed by removing the undoped MgZnO based compound layer 25 except a region of a width of approximately 1.5 μm for a gate length by etching. Thereafter, the transistor is formed by forming a source electrode 26 and a drain electrode 27 formed with, for example, a Ti film and an Al film on the electron transit layer 24 exposed by etching, and a gate electrode 28 formed by laminating, for example, a Pt film and an Au film on a surface of the undoped MgZnO based compound layer 25. By growing ZnO based compound semiconductor layers on the principal plane of the substrate 1 made of $Mg_xZn_{1-x}O$ ($0 \leq x \leq 0.5$) having the principal plane in which an A plane or an M plane is inclined in a direction of −c axis, even when a stress accompanied with a hetero junction works, a direction of a piezoelectric field generated by the stress is different from a direction of applying a gate voltage and transistor characteristics is not influenced. Moreover, since +C plane is exposed at step surfaces of the substrate, the ZnO based semiconductor layers laminated thereon are orientated to a direction of −c axis, thereby a high speed transistor (HEMT) with excellent crystallinity, a small leakage current and a high withstand voltage can be obtained.

INDUSTRIAL APPLICABILITY

Light emitting devices such as a LED, a laser diode or the like and transistor devices such as a HEMT or the like, using zinc oxide based compound semiconductor, can be improved in characteristics, and can be utilized for electronic appliances of various kinds using the semiconductor devices.

What is claimed is:

1. A zinc oxide based compound semiconductor device comprising:
    a substrate made of $Mg_xZn_{1-x}O$ ($0 \leq x < 1$), the substrate having a principal plane which is a plane that an A plane {11-20} or an M plane {10-10} is inclined in a direction of −c axis; and
    ZnO based compound semiconductor layers epitaxially grown on the principal plane of the substrate made of the $Mg_xZn_{1-x}O$.

2. The zinc oxide based compound semiconductor device according to claim 1, wherein an inclining angle in the direction of −c axis is 0.1 to 10 degrees.

3. The zinc oxide based compound semiconductor device according to claim 1, wherein the principal plane comprises terrace surfaces which are formed by inclining the A plane or the M plane, and step surfaces formed by inclining the terrace surfaces, the step surfaces being formed so as to be a +C plane with an equal interval and regularity.

4. The zinc oxide based compound semiconductor device according to claim 1, wherein ZnO based compound semiconductor layers are epitaxially grown on the substrate as a semiconductor lamination portion including a hetero junction so as to form a light emitting layer of a light emitting diode or a laser diode, thereby constituting a zinc oxide based compound semiconductor light emitting device.

5. The zinc oxide based compound semiconductor device according to claim 1, wherein the ZnO based compound semiconductor layers are epitaxially grown so as to form a transistor on the substrate.

* * * * *